United States Patent
Chong et al.

(10) Patent No.: US 12,431,418 B2
(45) Date of Patent: Sep. 30, 2025

(54) THREE DIMENSIONAL SEMICONDUCTOR TRACE LENGTH MATCHING AND ASSOCIATED SYSTEMS AND METHODS

(71) Applicant: Micron Technology, Inc., Boise, ID (US)

(72) Inventors: Chin Hui Chong, Singapore (SG); Seng Kim Ye, Singapore (SG); Kelvin Tan Aik Boo, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 545 days.

(21) Appl. No.: 17/750,140

(22) Filed: May 20, 2022

(65) Prior Publication Data

US 2023/0378043 A1 Nov. 23, 2023

(51) Int. Cl.
*H01L 23/498* (2006.01)
*H01L 21/48* (2006.01)

(52) U.S. Cl.
CPC .... *H01L 23/49838* (2013.01); *H01L 21/4846* (2013.01)

(58) Field of Classification Search
CPC .......... H01L 23/49838; H01L 21/4846; H01L 23/49816; H01L 25/18; H01L 2225/06506; H01L 2225/0651; H01L 2225/06527; H01L 2225/06562; H01L 25/0657
See application file for complete search history.

(56) References Cited

U.S. PATENT DOCUMENTS

| | | | | |
|---|---|---|---|---|
| 5,384,488 A | * | 1/1995 | Golshan | H01L 23/5329 257/E23.152 |
| 5,917,534 A | * | 6/1999 | Rajeswaran | B41J 2/45 347/238 |
| 2003/0107118 A1 | * | 6/2003 | Pflughaupt | H01L 23/528 257/E23.151 |
| 2013/0051587 A1 | * | 2/2013 | Stephanou | H04R 23/02 29/25.35 |
| 2016/0020166 A1 | * | 1/2016 | Hsieh | H01L 23/49838 257/773 |
| 2021/0074620 A1 | * | 3/2021 | Swan | G03F 1/38 |
| 2022/0068787 A1 | * | 3/2022 | Ronay | H01L 23/49838 |
| 2022/0399150 A1 | * | 12/2022 | Marin | H01F 27/2804 |
| 2023/0095931 A1 | * | 3/2023 | Mizori | G03F 7/0048 |
| 2023/0317543 A1 | * | 10/2023 | Brown | H01L 21/4846 257/14 |

* cited by examiner

*Primary Examiner* — Douglas W Owens
(74) *Attorney, Agent, or Firm* — Dorsey & Whitney LLP (57) ABSTRACT

Semiconductor devices with three-dimensional trace matching features, and related systems and methods, are disclosed herein. In some embodiments, an exemplary semiconductor device includes at least one semiconductor die and a redistribution layer disposed over the at least one semiconductor die and extending across a longitudinal plane. The redistribution layer includes first and second traces each electrically coupled to the at least one semiconductor die. The first trace is disposed in a first travel path included in a first effective path length. The second trace is disposed in a second travel path different from the first travel path. The second the second travel path includes at least one segment at a non-right, non-zero angle such that the at least one segment is neither parallel nor perpendicular to the longitudinal plane. Further, the second travel path is included in a second effective path length equal to the first path length.

19 Claims, 10 Drawing Sheets

THREE DIMENSIONAL SEMICONDUCTOR TRACE LENGTH MATCHING AND ASSOCIATED SYSTEMS AND METHODS

TECHNICAL FIELD

The present technology is generally related to systems and methods for trace length matching in a semiconductor device. In particular, the present technology relates to semiconductor devices with three-dimensional trace length matching features and methods for forming the same.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under continuous pressure to reduce the volume occupied by semiconductor devices while increasing the capacity and/or speed of the resulting semiconductor assemblies. To meet these demands, semiconductor die manufacturers often stack multiple semiconductor dies vertically on top of each other and increasingly tightly pack bonding sites and rerouting structures to increase the capacity and/or the performance of semiconductor devices within a limited area on a circuit board or other element to which the semiconductor devices and/or assemblies are mounted. As components are stacked and processing demands increase, the semiconductor devices often include a metallization layer with varying trace paths. The varying trace paths can help equalize an effective signal travel path between signal sources and destinations to help maintain necessary parity in the timing of signals and processing between components in the semiconductor device.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Semiconductor devices with three-dimensional trace matching features, and related systems and methods, are disclosed herein. In some embodiments, an exemplary semiconductor device includes a semiconductor die stack and a redistribution layer disposed over the semiconductor die and extending in a longitudinal plane. The semiconductor die stack (the "die stack") can include one or more semiconductor dies. The redistribution layer can include first and second traces that are each electrically coupled to one or more semiconductor dies in the die stack (e.g., both electrically coupled to a single die, both coupled to a plurality of dies, each coupled to a separate die, each coupled to a separate set of dies, and/or any other suitable configuration). The first trace is disposed in a first travel path that contributes to a first effective path length from a signal source (e.g., a controller die also electrically coupled to the die stack) to a signal destination (e.g., the one or more dies in the die stack). The second trace is disposed in a second travel path different from the first travel path. The second travel path contributes to a second effective path length from the signal source to the destination and is configured such that the second effective path is equal to the first effective path length. For example, the second travel path can include one or more segments that are neither parallel nor perpendicular to the longitudinal plane (e.g., at a non-right, non-zero angle to the longitudinal plane), thereby defining one or more trace length matching features in a three-dimensional space.

In a specific, non-limiting example, the first trace can connect the signal source to a furthermost die in the die stack with respect to the redistribution layer. The additional travel length from the redistribution layer increases the first effective path length and, if not compensated for, can delay the arrival of a signal to the furthermost die. The delayed delivery can then result in a lack of parity between signals and signal processing within the semiconductor device. To compensate for the additional travel length from the redistribution layer, the first travel path is disposed entirely in the longitudinal plane (e.g., the is fully parallel with the longitudinal plane) to minimize the first effective path length. Meanwhile, the second travel path can include a plurality of segments that are neither parallel to nor perpendicular to the longitudinal plane. The number of segments and/or orientation (e.g., angle and/or length) of each of the plurality of segments can be varied to increase the second effective path length such that the second effective path length is approximately equal (or equal) to the first effective path length. By equalizing the effective travel lengths, the redistribution layer can thereby help ensure parity between signal arrival and/or signal processing within the semiconductor device.

Further, an independent trace can include multiple segments that are neither parallel to nor perpendicular to the longitudinal plane. In some such embodiments, each of the segments has a generally similar orientation (e.g., relative angle and/or length). In some embodiments, each of the segments has a varied orientation to create a complex travel path. Further, in some embodiments, the independent trace includes one or more curves and/or a serpentine shape in the longitudinal plane in addition to the segments that are neither parallel to nor perpendicular to the longitudinal plane. In such embodiments, the independent trace takes advantage of three dimensions to match the effective path length associated with the independent trace to a predetermined length (e.g., the effective path length associated with another independent trace and/or a preset length various traces are matched to).

In some embodiments, independent traces can be partially layered in a vertical direction. purely by way of example, a first trace can include a segment filling a tough in the redistribution layer. The semiconductor device can then include an insulating material deposited over the segment, with a second trace formed in the insulating material. In such embodiments, the first and second traces each occupy an x-y coordinate in a longitudinal space while being electrically isolated by the insulating material in a z-dimension. As a result, a footprint of the redistribution layer in the longitudinal space can be reduced without reducing the amount of trace length matching possible in the redistribution layer.

In various embodiments, the redistribution layer can include any suitable number of independent traces. For example, the redistribution layer can include one, two, three, four, five, ten, fifty, one hundred, or any other suitable number of independent traces. Further, each of the independent traces can include one or more segments that are neither parallel nor perpendicular to the longitudinal plane of the redistribution layer. As discussed above, the one or more segments help adjust the effective travel lengths of signal paths associated with each of the independent traces. In some embodiments, accordingly, each of the independent traces includes a different number of and/or orientation of segments that are neither parallel nor perpendicular to the longitudinal plane. The individual customization can help ensure that each of the independent traces is associated with a relatively equal effective travel path and/or that various subsets of the independent traces are associated with relatively equal effective travel paths for each subset.

For ease of reference, the three-dimensional trace length matching features are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the three-dimensional trace length matching features, and the associated semiconductor components and devices, can be moved to, and used in, different spatial orientations without changing the structure and/or function of the disclosed embodiments of the present technology.

Further, although primarily discussed herein as three-dimensional trace length matching features for use on a package-level redistribution structure, one of skill in the art will understand that the scope of the invention is not so limited. For example, the three-dimensional trace length matching features can also be deployed on individual semiconductor components (e.g., in redistribution layers directly on semiconductor dies in fan-out-packaging and the like), in multiple structures in a semiconductor package, and/or in larger semiconductor structures (e.g., in system-level packages such as digital double rate (DDR) packages). Accordingly, the scope of the invention is not confined to any subset of embodiments.

DESCRIPTION OF THE FIGURES

Figure 1A:
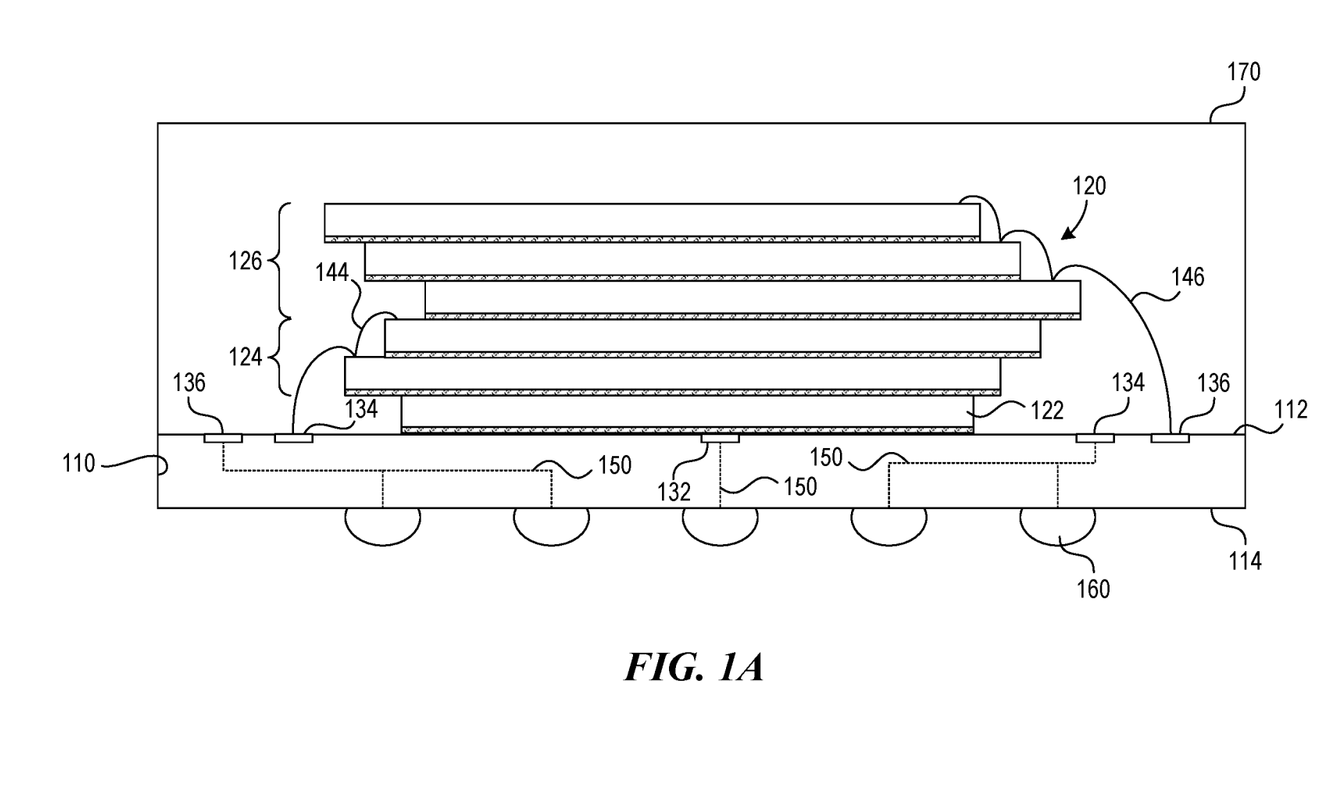
FIG. 1A is a cross-sectional view of a semiconductor device in accordance with some embodiments of the present technology.
Figure 1B:
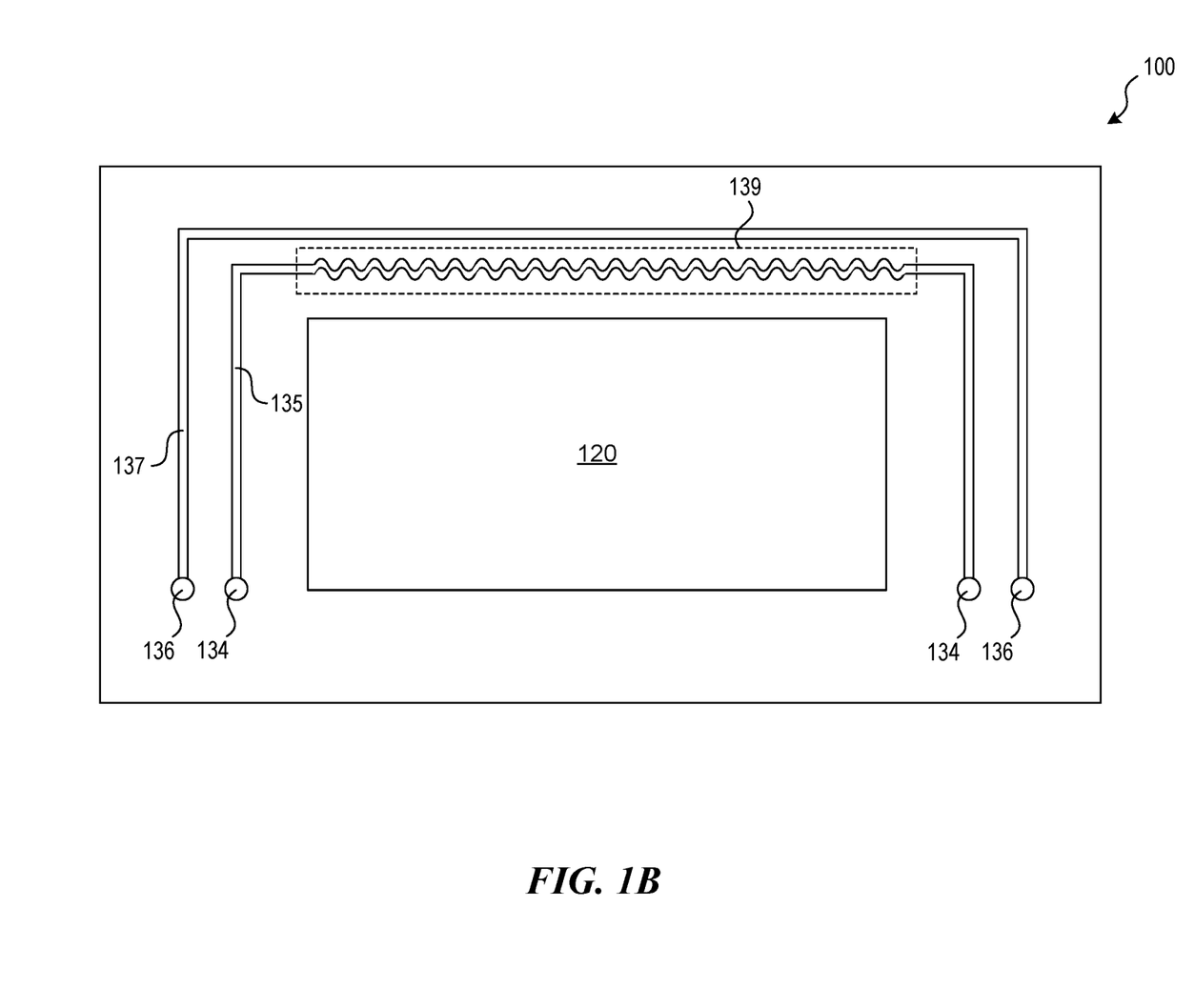
FIG. 1B is a top plan view illustrating a few trace length matching features of the semiconductor device of FIG. 1A in accordance with some embodiments of the present technology.

FIGS. 1A and 1B are a cross-sectional view and a top plan view, respectively, of a semiconductor device 100 in accordance with some embodiments of the present technology. As best illustrated with respect to FIG. 1A, the semiconductor device 100 ("device 100") includes a package support substrate 110 ("substrate 110") that includes a first surface 112 (e.g., an upper surface) and a second surface 114 (e.g., a lower surface) opposite the first surface 112. The device 100 also includes a stack of semiconductor dies 120 ("die stack 120") carried by a redistribution layer 130 (illustrated schematically) at the first surface 112 of the substrate 110. In various embodiments, the die stack 120 can include any number of one or more dies (six shown) that can each be electrically coupled to the redistribution layer 130 individually and/or in series.

For example, in the illustrated embodiment, the redistribution layer 130 includes one or more first bond sites 132 (e.g., bond pads, conductive contacts, and the like) electrically coupled to a lowermost die 122 (e.g., a controller die) in the die stack; one or more second bond sites 134 (two shown) electrically coupled to a first sub-stack 124 carried by the lowermost die 122; and one or more third bond sites 136 (two shown) electrically coupled to a second sub-stack 126 carried by the first sub-stack 124. The electrical coupling between the die stack 120 and the first-third bond sites 132-136 can be accomplished through a variety of techniques. In the illustrated embodiment, for example, the lowermost die 122 is electrically coupled to the first bond sites 132 via a flip-chip orientation and direct bonding; the first sub-stack 124 is electrically coupled to the second bond sites 134 via first wire bonds 144; and the second sub-stack 126 is electrically coupled to the third bond sites 136 via second wire bonds 146.

As further illustrated in FIG. 1A, the device 100 further includes a molding compound 170 at least partially covering the die stack 120 and an array of package connection terminals 160 at the second surface 114 of the substrate 110. Each of the package connection terminals 160 is electrically coupled to the redistribution layer 130 via through-substrate connections 150 (e.g., further redistribution layers, through substrate vias, interconnects, and the like). As a result, signals can be communicated to and from each of the dies in the die stack 120 through the package connection terminals 160.

Purely by way of example, each of the dies in the first and second sub-stacks 124, 126 can be a logic die that receives commands from a controller outside of the device 100, while the lowermost die 122 is a memory die. In such embodiments, it can be important for each of the dies in the first and second sub-stacks 124, 126 to receive the control signals at least approximately in sync and/or according to a common clock schedule. This requirement helps maintain (1) a global clock schedule in the device 100, (2) parity in the timing of signals arriving at and departing from the die stack 120, and (3) intended parity in processing between dies in the die stack 120. However, as illustrated in FIG. 1A, the second wire bonds 146 are longer than the first wire bonds 144. This increased length is due to the second wire bonds 146 being electrically coupled to higher dies in the die stack 120 (e.g., an unavoidable feature of the die stack). This increased travel distance can lead to differences in the travel time for signals related to the dies in the first and second sub-stacks 124, 126. In turn, the differences in travel time can desync the signals and/or the dies in the first and second sub-stacks 124, 126.

To help avoid desync, as best illustrated in FIG. 1B, the redistribution layer 130 can also include trace length matching features within longitudinal traces extending between corresponding second and third bond sites 134, 136. For example, in the illustrated embodiment, a first trace 135 extends between the second bond sites 134 while a second trace 137 extends between the third bond sites 136. While the second trace 137 extends in a straight, rectangular path between the third bond sites 136, the first trace 135 includes a serpentine path in a region 139 that increases the overall travel path for signals to the first sub-stack 124. The inclusion of the serpentine path in the region 139 can therefore help account for the unavoidable longer path for signals to the second sub-stack 126. Said another way, the serpentine path in the region 139 is a trace length-matching feature that helps ensure the overall travel paths for signals to the dies in the first and second sub-stacks 124, 126 is about equal (or equal).

Figure 2A:
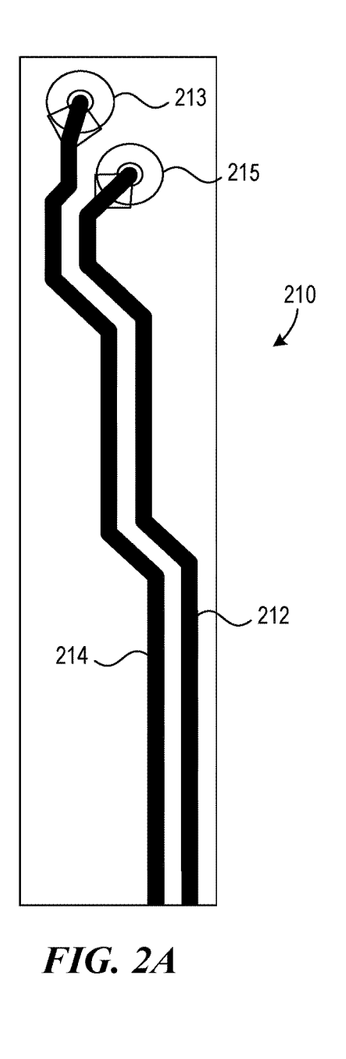
FIGS. 2A and 2B are partially schematic top views of a few trace length matching features that can be deployed in a semiconductor device in accordance with some embodiments of the present technology.
Figure 2B:
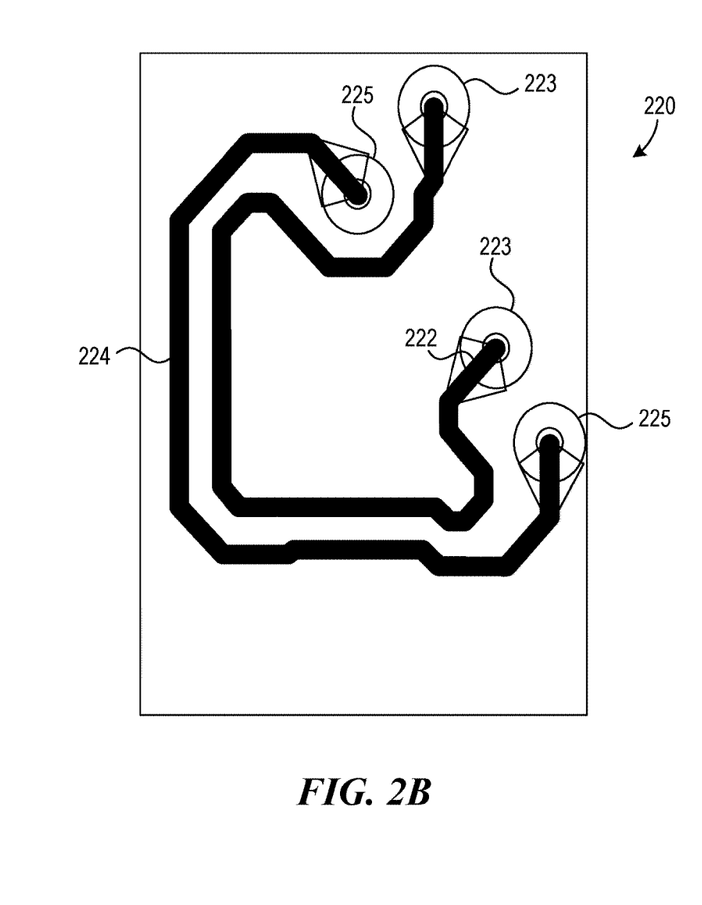

FIGS. 2A and 2B are partially schematic top views of redistribution layers having examples of trace length matching features in accordance with some embodiments of the present technology. In the illustrated embodiments, the trace matching features help maintain parity in the length of the illustrated traces, rather than an overall parity in the length of the travel paths for signals. One of skill in the art will understand, however, that any of the trace length matching features can be employed to help maintain parity in the overall length in the travel paths for signals (e.g., when signals travel to and from various dies in a stack of semiconductor dies).

In the embodiment illustrated in FIG. 2A, the redistribution layer 210 includes a first trace 212 electrically coupled to a first terminal 213 and a second trace 214 electrically coupled to a second terminal 215. In the illustrated embodiment, the first and second traces 212, 214 have a relatively direct path with minor bends and/or changes in direction to avoid one or more electrical components (not shown) electrically coupled to and/or carried by the redistribution layer 210. Further, in the illustrated embodiment, the first and second traces 212, 214 have generally similar paths (e.g., each bend and/or change in direction in one is matched by a bend or change in direction in the other). Indeed, the only difference in the travels paths is based on the relative locations of the first and second terminals 213, 215. As a result, the first and second traces 212, 214 can have a generally similar length.

In the embodiment illustrated in FIG. 2B, the redistribution layer 220 includes a first trace 222 electrically coupled between first terminals 223 and a second trace 224 electrically coupled between second terminals 225. In the illustrated embodiment, the first and second traces 222, 224 each have a curved path, with the second trace 224 positioned around the outside of the curve and therefore having a longer travel distance. The curved path can connect the first and second terminals 223, 225 while avoiding one or more electrical components (not shown) electrically coupled to and/or carried by the redistribution layer 220. To help account for the additional length of the outside of the curve, as illustrated, the first terminals 223 can be set farther apart and/or the first trace 222 can include additional segments. As a result, the first and second traces 212, 214 can have a generally similar length.

As discussed above, it will be understood that the trace length adjusting features discussed above (e.g., parity in travel paths, curved travel paths, additional segments, and the like) can be employed to intentionally differentiate the length of the traces in a redistribution layer in order to maintain parity in overall signal travel paths.

Figure 3:
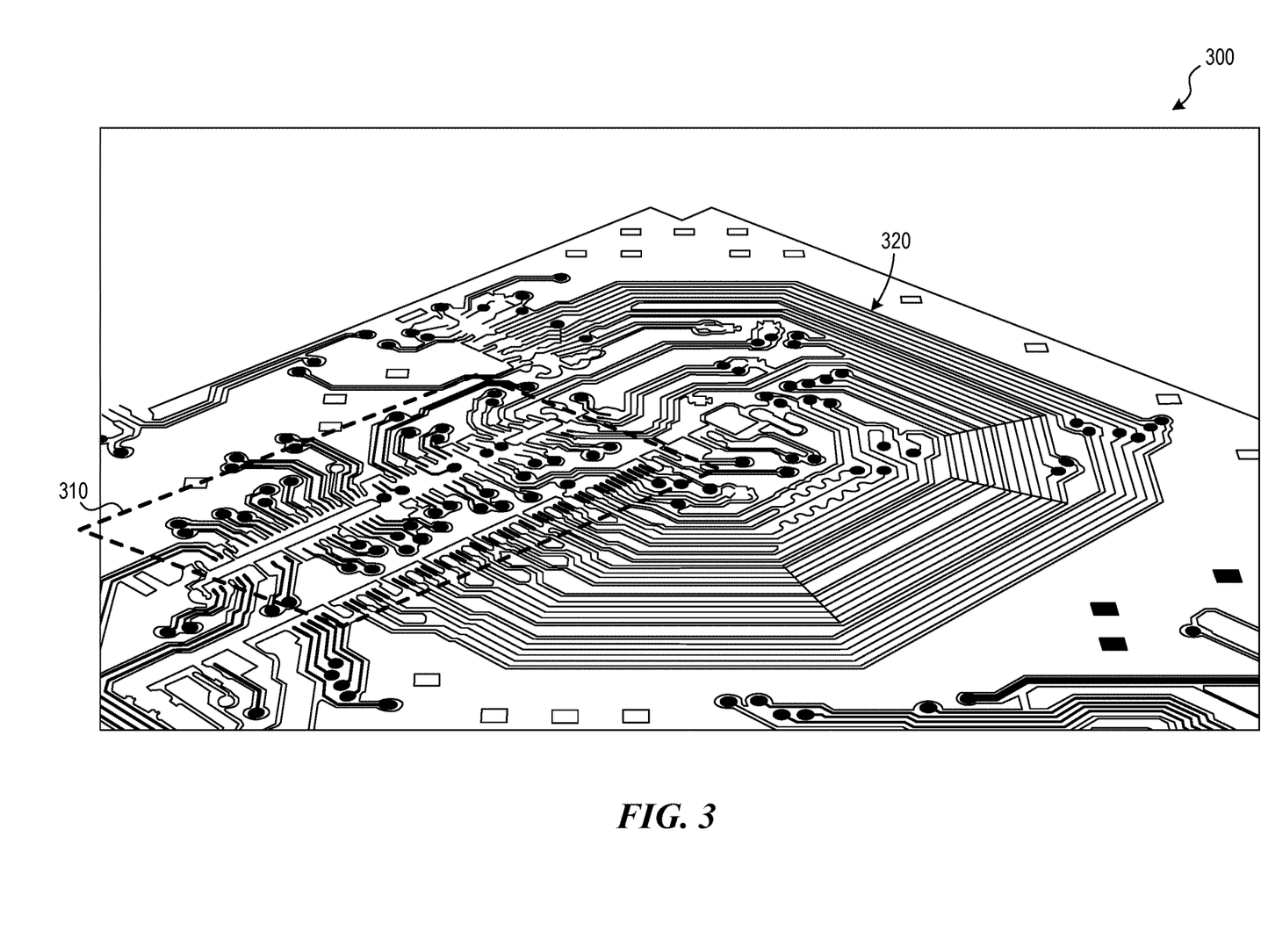
FIG. 3 is a partially schematic isometric view of package substrate having various trace length matching features in accordance with some embodiments of the present technology.

For example, FIG. 3 is a partially schematic isometric view of redistribution layer 300 having various trace length matching features in accordance with some embodiments of the present technology. In the illustrated embodiment, the redistribution layer includes a region 310 with a plurality of bond sites as well as an array of traces 320 electrically coupled to the bond sites. As further illustrated, the redistribution layer 300 includes various trace-length matching features, such as curved travel paths that increase in length on the outside of the curves; serpentine segments of traces that increase the length of a trace while traveling generally in a single direction; additional segments stretching to distant bond sites; as well as a few traces that parallel each bend and/or change in direction. These trace-length matching features can help ensure that the overall length of signal travel paths connected to the bond sites in the region 310 are generally equal (or equal) and/or intentionally set off by a distance corresponding to a discrete clock cycle unit. As a result, any semiconductor components (e.g., memory die, logic die, controller die, capacitors, transistors, resistors, and the like) electrically coupled to the bond sites in the region 310 can maintain parity in the timing of signals to and from the semiconductor components and/or the signal processing therein.

The redistribution layer 300 can be positioned at any suitable level of a semiconductor device. Purely by way of example, the redistribution layer 300 can be positioned over (e.g., carried by, attached to, formed on, and the like) an individual semiconductor die to electrically couple components of the die and/or electrically couple the die to any other suitable structure. In another example, the redistribution layer 300 can included on (e.g., carried by, attached to, formed on, and the like) a package substrate of a stacked semiconductor device to electrically couple components of the stacked semiconductor device. In yet another example, the redistribution layer 300 can included on (e.g., carried by, attached to, formed on, and the like) a printed circuit board (or other substrate) of a memory device (e.g., a Double Data Rate Synchronous Dynamic Random-Access Memory (DDR SDRAM)) having a plurality of semiconductor devices to electrically couple to each of the plurality of semiconductor devices. In each instance, the redistribution layer 300 can help maintain parity in the timing of signals to and from the semiconductor components and/or the signal processing therein.

However, as illustrated in FIG. 3, the redistribution layer 300 can require a relatively large longitudinal footprint in order to include each of the trace matching features. As components (e.g., semiconductor dies) continue to shrink and/or be packed more densely into semiconductor devices, the necessary longitudinal footprint of the trace matching features.

Figure 4A:
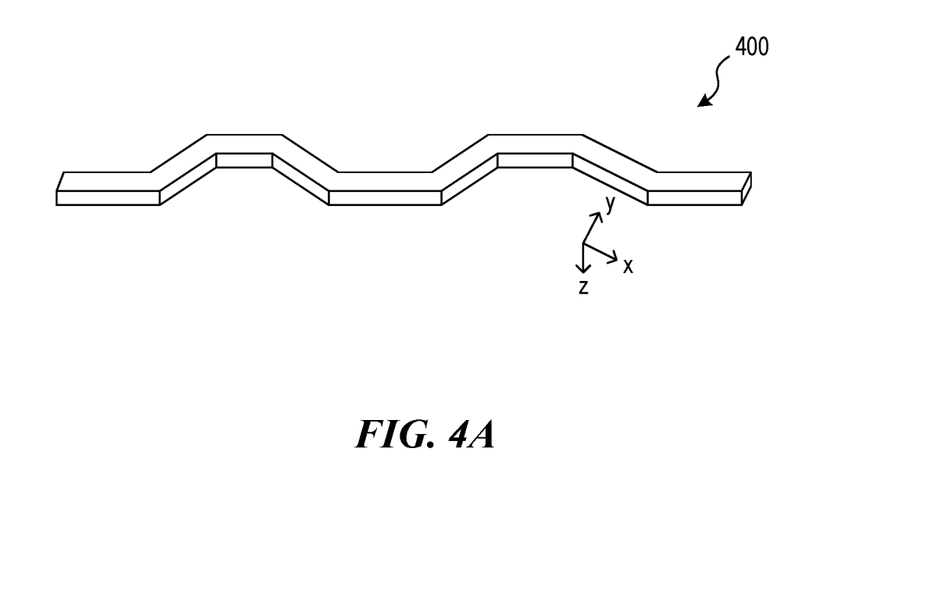
FIGS. 4A and 4B are schematic isometric views of a process for matching a trace length in a three-dimensional space in accordance with some embodiments of the present technology.
Figure 4B:
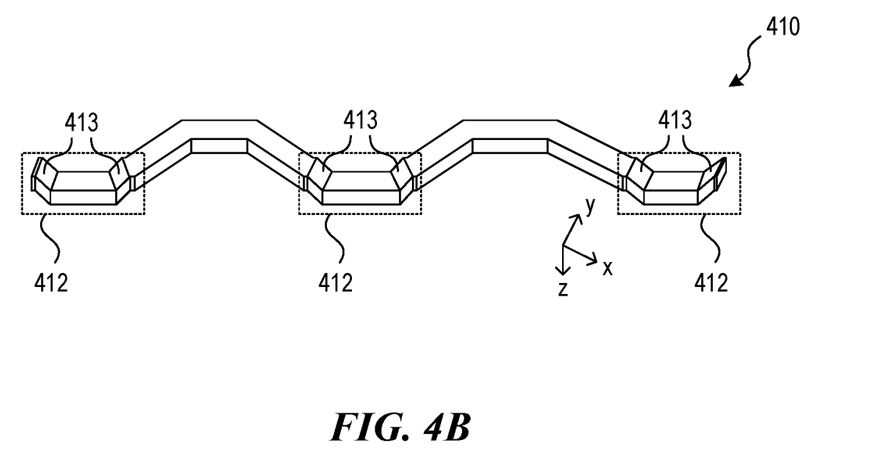

FIGS. 4A and 4B are schematic isometric views illustrating a length matching feature in a three-dimensional space in accordance with some embodiments of the present technology. In particular, FIG. 4A illustrates a trace 400 that has a serpentine pathway in a longitudinal plane. Said another way, while the trace 400 extends generally in an x-direction in the illustrated embodiment, the trace also includes a plurality of segments that have y-direction components. Each of the segments with a component in the y-direction increases the overall length of the trace 400 to travel the same distance in the x-direction (e.g., between two bond sites). Accordingly, as discussed above, the serpentine shape can be used to match the length of the trace 400 to a predetermined length (e.g., to maintain overall signal travel path parity).

FIG. 4B illustrates a trace 410 that has a serpentine pathway in three dimensions. As illustrated, the trace 410 is similar to the trace 400 discussed above with reference to FIG. 4A. For example, the trace 410 extends generally in an x-direction and includes a plurality of segments that have y-direction components. In the illustrated embodiment, however, the trace 410 also includes a plurality of segments 413 in regions 412 that have z-direction components. Each of the segments 413 in the regions 412 increases the overall length of the trace 410 to travel the same distance in the x-direction (e.g., between two bond sites). Accordingly, while the trace 410 extends generally in the longitudinal plane, each of the segments 413 in the regions 412 is a trace matching feature extending at least partially in the vertical direction (also referred to herein as "three-dimensional trace length matching features," "z-direction trace matching features," "vertical serpentine pathway," "z-direction serpentine pathway," and the like). Said another way, each of the segments 413 in the regions 412 includes portions that are neither parallel nor perpendicular to the longitudinal plane. As a result, each of the segments 413 in the regions 412 can be used to match the length of the trace 410 to a predetermined length (e.g., to maintain overall signal travel path parity).

In the illustrated embodiment, the vertical trace matching features are combined with the longitudinal trace matching features. As a result, the trace 410 has a longer travel path between two points in the x-direction than the trace 400 illustrated in FIG. 4A without also increasing the longitudinal footprint (e.g., in the x-y plane) and/or occupying more space within the longitudinal footprint. Said another way, the trace 410 can be matched to a longer predetermined length than the trace 400 with the same amount of available space in the longitudinal plane. Alternatively, it will be understood that the vertical trace matching features can be deployed in place of the longitudinal trace matching features to match the predetermined length without requiring any extra space in the longitudinal plane. Accordingly, as redistribution layers become more compact, include more traces, and/or otherwise become more constrained for space, the vertical trace matching features can be employed to help alleviate space constraints.

Figure 5:
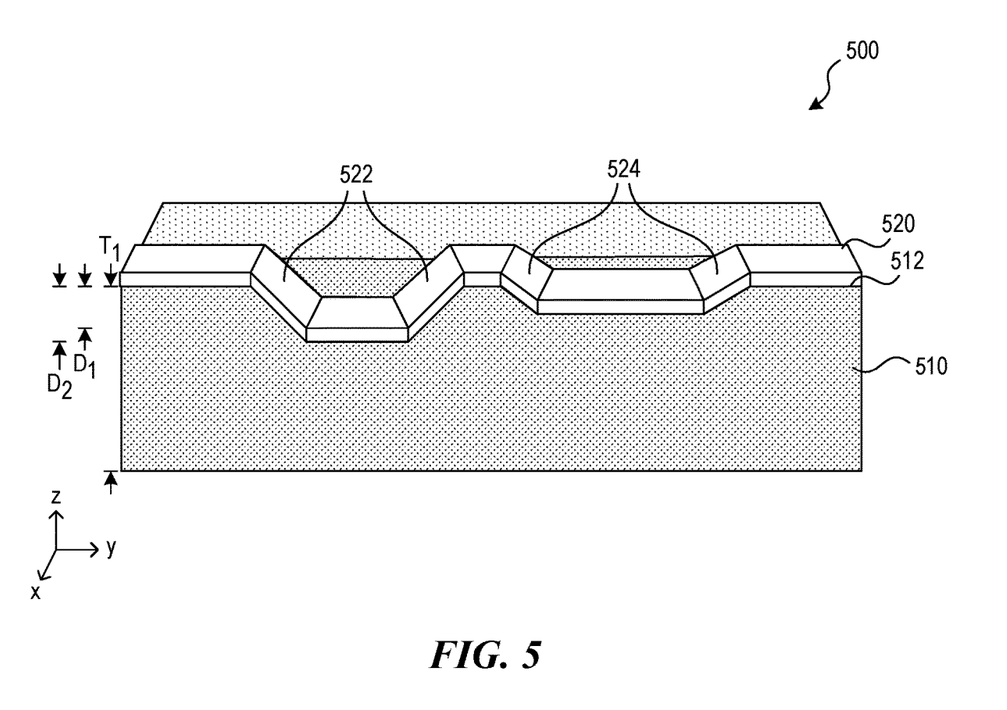
FIG. 5 is a partially schematic cross-sectional view of a semiconductor device having three-dimensional trace length matching features in accordance with some embodiments of the present technology.

FIG. 5 is a partially schematic cross-sectional view of a semiconductor device 500 having three-dimensional trace length matching features in accordance with some embodiments of the present technology. As illustrated in FIG. 5, the semiconductor device 500 ("device 500") includes a semiconductor substrate 510 ("substrate 510") having an upper surface 512 disposed in a longitudinal plane (e.g., in the x-y plane). As further illustrated in FIG. 5, the device 500 also includes a trace 520 carried by the upper surface 512 and extending generally in the y-direction across the longitudinal plane. The substrate can be any suitable semiconductor material, such as a silicon substrate forming the body of a semiconductor die, a laminated composite (e.g., forming a printed circuit board (PCB)), resins, and the like). The trace can be any suitable conductive material (e.g., copper, gold, and the like) forming a part of a redistribution layer over the upper surface 512 of the substrate 510. For example, although only illustrated with a single trace 520, the device 5500 can include any other suitable number of traces (e.g., two, five, ten, one hundred, etc.) that can each be carried by an upper surface 512 of the substrate 510 and extend generally across the longitudinal plane. Similar to the traces discussed above with respect to FIGS. 1B-4, the trace 520 (and any other traces on the device 500) can extend between two bond sites to electrically coupled any suitable component of the device 500 and/or any other electrically coupled component.

In the illustrated embodiment, the trace 520 includes first and second segments 522, 524 that are each oriented at least partially in the z-direction in addition to the y-direction. As a result, each of the first and second segments 522, 524 are neither parallel nor perpendicular to the longitudinal plane. Further, because the first and second segments 522, 524 depart from a travel path directly across the longitudinal plane, they each increase the overall length of the trace 520. In the illustrated embodiment, however, the first and second segments 522, 524 do not result in the same increase to the overall length of the trace 520. For example, the first segments 522 extend to a first depth $D_1$ while the second segments 524 extend to a second depth $D_2$. In the illustrated embodiment, the first depth $D_1$ is larger than the second depth $D_2$. In other embodiments, the first and second depths $D_1$, $D_2$ can be generally equal and/or the second depth $D_2$ can be larger than the first depth $D_1$.

The first and second depths $D_1$, $D_2$ are limited by a thickness $T_1$ of the substrate 510. In various embodiments, the first and second depths $D_1$, $D_2$ can have a maximum possible value equal to (or less than) about 5 percent of the thickness $T_1$, about 10 percent of the thickness $T_1$, about 20 percent of the thickness $T_1$, or about 50 percent of the thickness $T_1$. In a specific, non-limiting example, the substrate 510 can be an interposer comprised of prepreg material. In this example, the first and second depths $D_1$, $D_2$ can have a maximum value of between about 10 percent and about 20 percent of the thickness of the prepreg. In some embodiments of this example, the thickness $T_1$ of the substrate 510 is between about 100 microns (μm) and about 200 In such embodiments, the first and second depths $D_1$, $D_2$ can have a maximum value between about 10 μm and about 40 μm.

Figure 6:
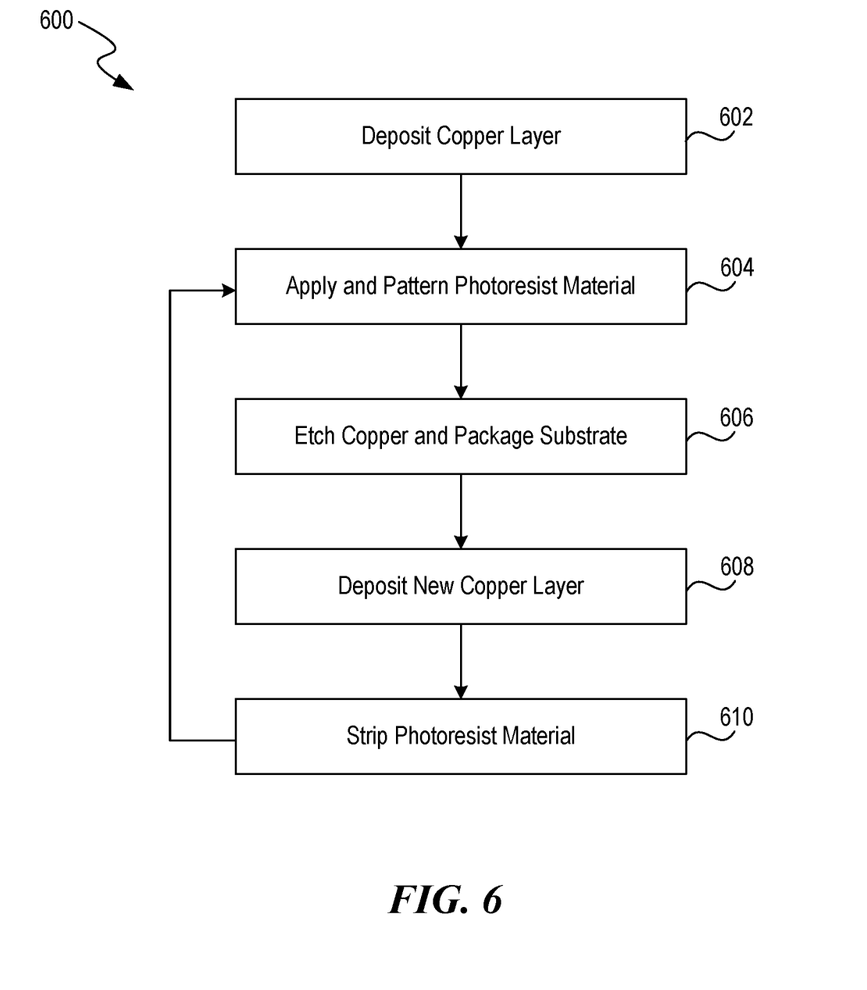
FIG. 6 is a flow diagram of a process for manufacturing a semiconductor substrate with three-dimensional trace matching features in accordance with some embodiments of the present technology.

FIG. 6 is a flow diagram of a process 600 for manufacturing a semiconductor substrate with three-dimensional trace matching features in accordance with some embodiments of the present technology. In the illustrated embodiment, the process 600 begins at block 602 with depositing a first layer of a conductive material ("first conductive layer") on a surface of a semiconductor substrate. In various embodiments, the first conductive layer can include copper, gold, aluminum, nickel, and/or any other suitable conductive material. In some embodiments, the first conductive layer is deposited in a blanket deposition process. In some embodiments, the deposition process at block 602 includes one or more selective deposition processes to apply the conductive layer only in predetermined areas (e.g., in areas corresponding to one or more sections of a trace that will be positioned in a longitudinal plane on top of the surface of the semiconductor substrate). Purely by way of example, the deposition process at block 602 can include applying a photoresist material, patterning the photoresist material in accordance with one or more planned traces, depositing the first conductive layer into the patterned photoresist material, and stripping the photoresist material.

At block 604, the process 600 includes applying a photoresist material over the first conductive layer and patterning the photoresist material to expose one or more portions of the first conductive layer. The patterned photoresist material exposes portions of the first conductive layer and/or semiconductor substrate corresponding to segments of the completed trace that are neither parallel to nor perpendicular to a longitudinal plane of the surface of the semiconductor substrate (e.g., the regions 412 discussed above with reference to FIG. 4B).

At block 606, the process 600 includes etching the first conductive layer and the semiconductor substrate to a predetermined depth in the surface of the semiconductor substrate. The etching process at block 606 forms one or more trenches (sometimes also referred to herein as troughs) in the surface of the package substrate that will support the vertical segments of the completed trace. Further, the predetermined depth can be selected and/or calibrated based on a desired length of the completed trace (e.g., to match the length of the completed trace to a predetermined and/or desired length).

In some embodiments, the process 600 can repeat all, or a part of, blocks 604 and 606 to form multiple etches forming trenches of varying depths in the surface of the semiconductor substrate. For example, the process can include forming a first in a photoresist material, etching the first conductive layer and the semiconductor substrate through the first pattern, forming a second pattern to expose the first conductive layer in additional locations, and further etching the first conductive layer and the semiconductor substrate through the second pattern. Areas exposed by the first pattern will be etched to a deeper depth than areas only exposed by the second pattern. Variations in the depth of one or more of the trenches can allow, for example, the trenches in a first completed trace to be calibrated to a first overall length and trenches in a second completed trace to be calibrated to a second overall length. Additionally, or alternatively, the variations can help calibrate the overall length of a single completed trace to a wider range of overall lengths.

At block 608, the process 600 includes depositing a second conductive layer over and/or into the patterned photoresist layer. As a result, the second conductive layer fills the trench(es) formed in the semiconductor substrate at block 606 and is electrically coupled to the first conductive layer at the edges of the pattern in the photoresist layer. In various embodiments, the second conductive layer can include copper, gold, aluminum, nickel, and/or any other suitable conductive material. In some embodiments, the second conductive layer is the same conductive material as the first conductive layer. Purely by way of example, if the first conductive layer is copper, depositing the second conductive layer can include depositing a new copper layer into the trench(es). In some embodiments, the second conductive layer is deposited in a blanket deposition process over the photoresist material. In some embodiments, the deposition process at block 602 includes one or more selective deposition processes to apply the second conductive layer only in predetermined areas (e.g., in areas corresponding to the trench(es)).

At block 610, the process 600 includes stripping the remaining photoresist material off the semiconductor substrate. In some embodiments, stripping the photoresist material also strips excess portions of the second conductive layer off of the semiconductor device. As a result, a completed three-dimensional trace can be left behind once the photoresist material is stripped off the semiconductor substrate.

In some embodiments, the process 600 further includes depositing a second photoresist layer, patterning the second photoresist layer to expose portions of the first and/or second conductive layers, and etching the first and/or second conductive layers to isolate one or more traces. The additional steps can be necessary to isolate traces, for example, when the first and/or second conductive layers were not selectively deposited.

In some embodiments, the process 600 can return to block 604 after stripping the photoresist layer at block 610 to deposit a second photoresist layer. By cycling through blocks 604-610, the process 600 can form trenches with varying depths. Purely by way of example, the process 600 can cycle through blocks 604-610 a first time to form trenches in a first trace at a first predetermined depth, then cycle through blocks 604-610 a second time to form trenches in a second trace at a second predetermined depth. Additionally, or alternatively, the process 600 can cycle through blocks 604-610 multiple times in order to form trenches of varying depths in a single trace.

In some embodiments, the process 600 can include additional steps and/or selectively cycle through blocks 604-610. Purely by way of example, the process 600 can include depositing a second semiconductor material over the second conductive layer before stripping the photoresist material. The second conductive material can help insulate the second conductive layer in the trenches and/or support additional semiconductor components over the segments of a completed trace that are within the trenches. Purely by way of example, the process 600 can then selectively cycle through blocks 604-610 to deposit a second photoresist material, pattern the second photoresist material according to a desired shape for a new trace, deposit a third conductive layer to form the new trace, then strip the second photoresist material. In such embodiments, one or more segments of the new trace can be supported by the second semiconductor material over the trenches. As a result (an example of which is illustrated below with respect to FIG. 8), the process 600 can stack trace matching features in a vertical direction, thereby providing additional trace matching features within a given longitudinal space.

Figure 7A:
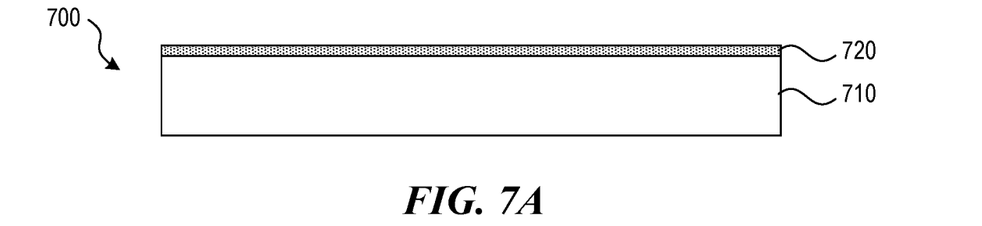
FIGS. 7A-7E are partially schematic cross-sectional views of a semiconductor substrate at various stages of a process of the type shown in FIG. 6 in accordance with some embodiments of the present technology.

FIGS. 7A-7E are partially schematic cross-sectional views of a semiconductor device 700 at various stages of a process of the type shown in FIG. 6 in accordance with some embodiments of the present technology. For example, FIG. 7A illustrates the semiconductor device 700 after a first conductive layer 720 has been deposited on a surface of a semiconductor substrate 710 in the semiconductor device 700.

Figure 7B:
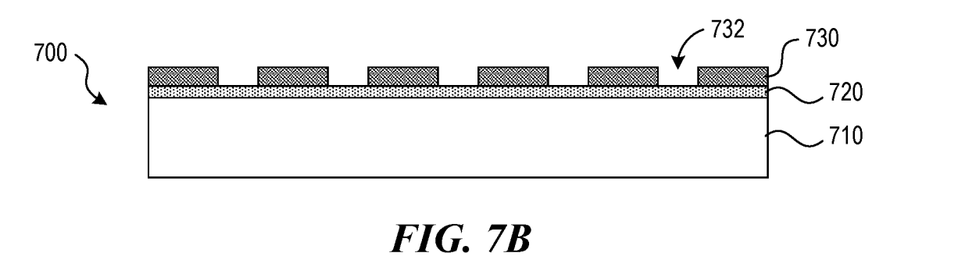

FIG. 7B illustrates the semiconductor device 700 after a photoresist material 730 has been deposited over the first conductive layer 720. As further illustrated in FIG. 7B, the photoresist material 730 has been patterned to form holes 732 that expose portions of the first conductive layer 720.

Figure 7C:
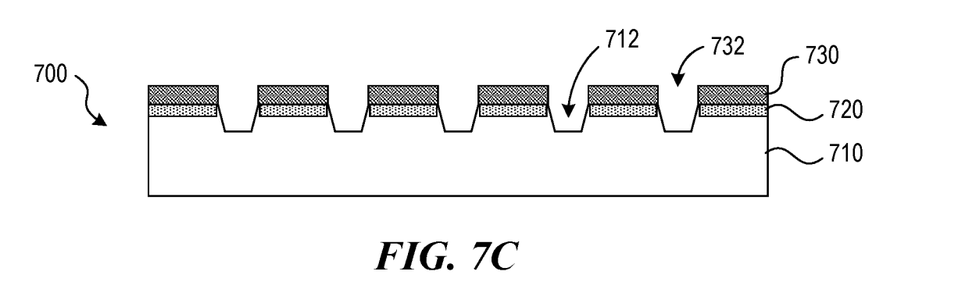

FIG. 7C illustrates the semiconductor device 700 after an etching process through the holes 732 in the photoresist material 730. As illustrated in FIG. 7C, the etching process has removed the exposed portions of the first conductive layer 720 and formed trenches 712 (sometimes also referred to herein as troughs) in the surface of the semiconductor substrate 710. In various embodiments, the trenches 712 can each have the same depth and/or can be etched to a variety of depths in the semiconductor substrate 710.

Figure 7D:
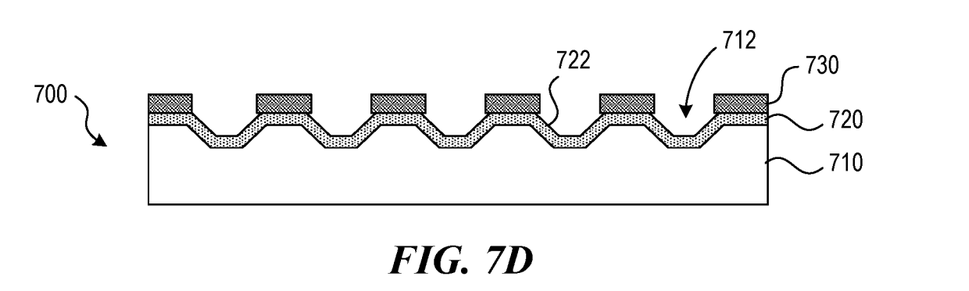

FIG. 7D illustrates the semiconductor device 700 after selectively depositing a second conductive layer 722 into the trenches 712 in the semiconductor substrate 710. As illustrated in FIG. 7D, the second conductive material 722 is electrically bonded to the first conductive layer 720 at the edges of the trenches 712. In the illustrated embodiment, the second conductive layer 722 is the same material (e.g., copper, gold, and the like) as the first conductive material 720, which can help form strong electrical connections between the two.

Figure 7E:
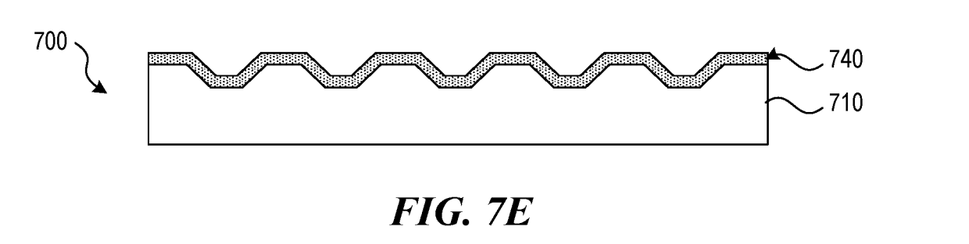

FIG. 7E illustrates the semiconductor device 700 after the photoresist material 730 (FIG. 7D) has been stripped off of the semiconductor device 700. As illustrated, one result of the process is trace 740 that includes segments that are neither parallel nor perpendicular to the longitudinal plane of the surface of the semiconductor substrate 710, thereby defining trace length matching features that are in a three-dimensional space.

Figure 8:
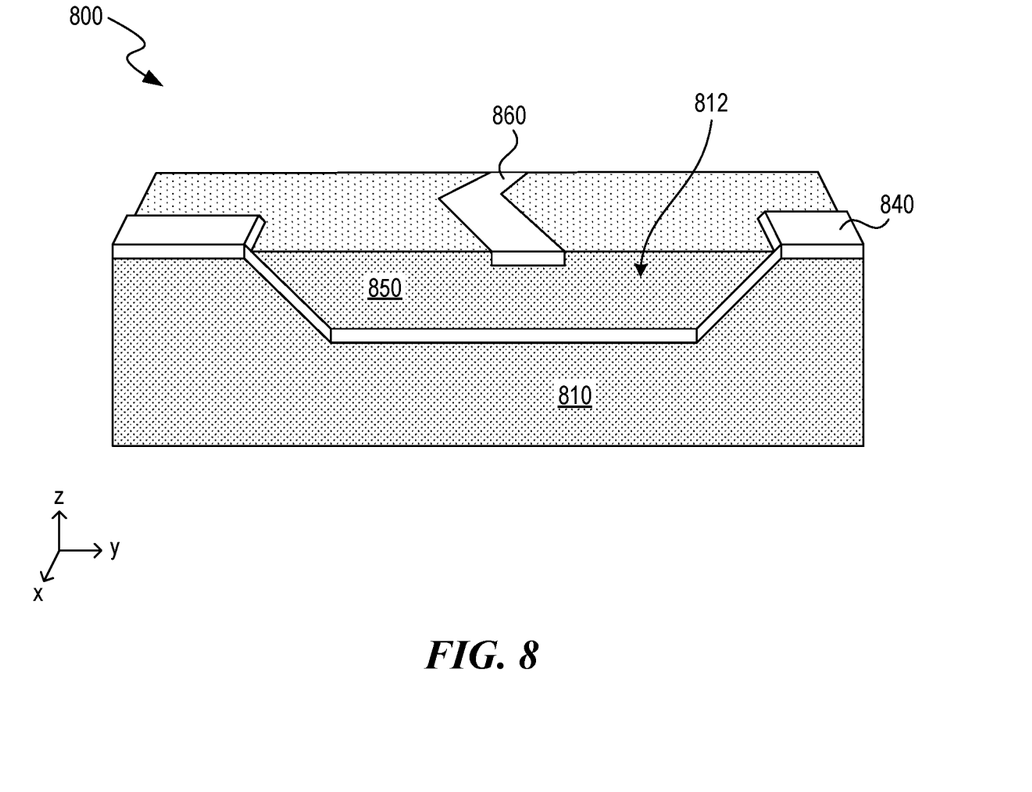
FIG. 8 is a partially schematic cross-sectional view of a semiconductor device having three-dimensional trace length matching features in accordance with further embodiments of the present technology.

FIG. 8 is a partially schematic cross-sectional view of a semiconductor device 800 having three-dimensional trace length matching features in accordance with further embodiments of the present technology. In the illustrated embodiment, the semiconductor device 800 includes a first trace 840 with segments that are neither parallel nor perpendicular to the longitudinal plane of the surface of the semiconductor substrate 810 (e.g., three-dimensional trace length matching features).

As further illustrated in FIG. 8, a second semiconductor substrate 814 has been deposited over the first trace 840 in the trenches 850 (one shown) formed in the first semiconductor substrate 810 to support the three-dimensional features of the first trace 840. In various embodiments, the second semiconductor substrate 814 can be an insulating material, a molding material, a prepreg material, an encapsulant, and/or any other suitable semiconductor substrate. Accordingly, the second semiconductor substrate 814 can insulate the segments of the first trace 840 that are within the trenches 850 and/or support one or more features of a semiconductor device over the trenches 850. Purely by way of example, a bond pad or other electrical component (e.g., a capacitor or resistor) can be supported by the second semiconductor substrate 814 to further reduce the longitudinal footprint of the semiconductor device 800.

Additionally, or alternatively, and as illustrated in FIG. 8, the second semiconductor substrate 850 can support a second trace 860 crossing over the first trace 840. Said another way, the second semiconductor substrate 850 can allow three-dimensional stacking of the first and second traces 840, 860, thereby allowing additional trace matching features to be packed into a given longitudinal area. For example, in the illustrated embodiment, the first trace 840 has a vertically oriented serpentine shape while the second trace 860 has a horizontal serpentine shape.

Figure 9:
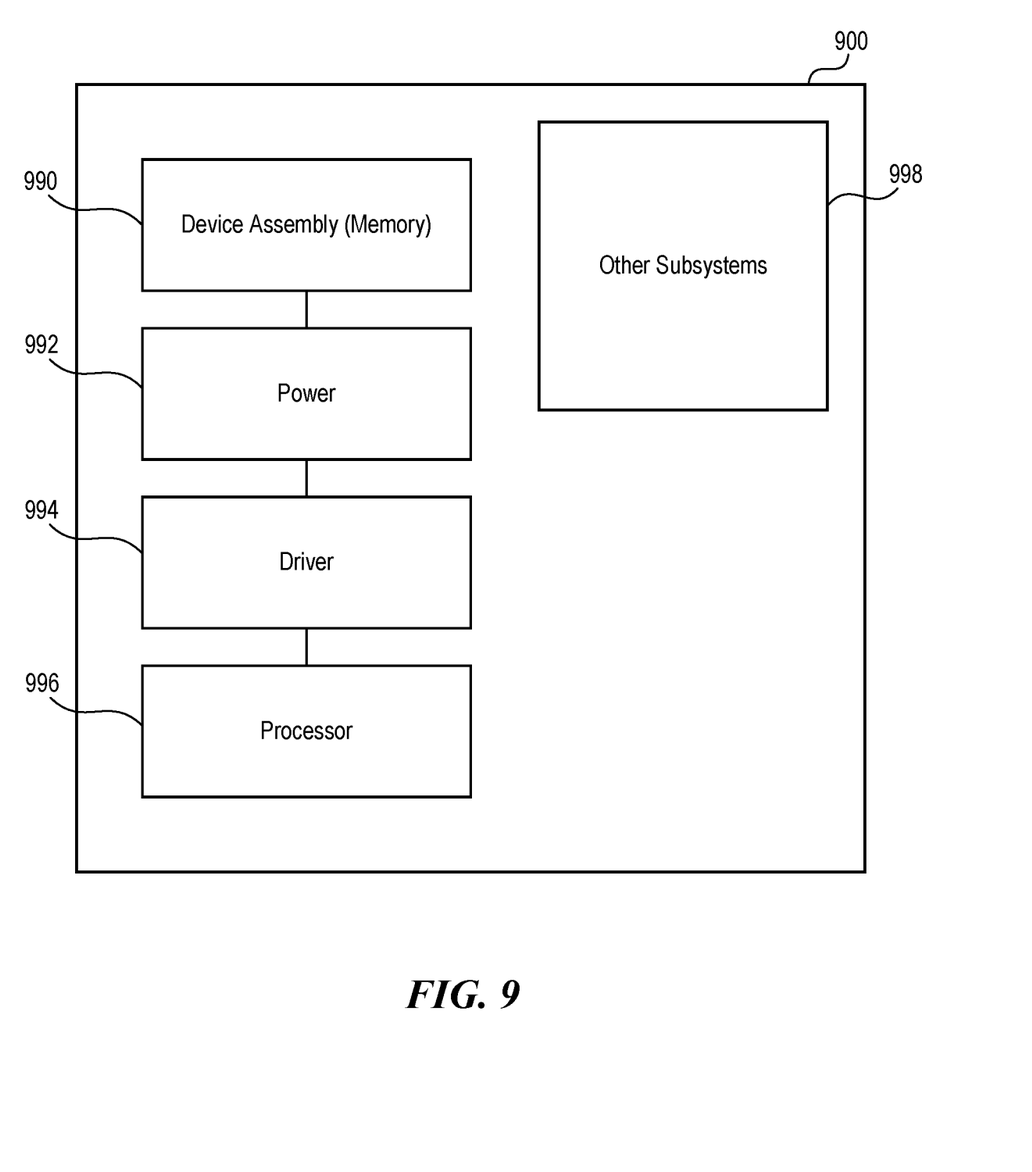
FIG. 9 is a schematic view of a system that includes a semiconductor die assembly configured in accordance with embodiments of the present technology.

FIG. 9 is a schematic view of a system that includes a semiconductor die assembly configured in accordance with embodiments of the present technology. Any one of the semiconductor devices having the trace matching features and/or resulting from the processes described above with reference to FIGS. 1A-8 can be incorporated into any of a myriad of larger and/or more complex systems, a representative example of which is system 900 shown schematically in FIG. 9. The system 900 can include a memory 990 (e.g., SRAM, DRAM, flash, and/or other memory devices), a power supply 992, a drive 994, a processor 996, and/or other subsystems or components 998. Semiconductor devices having three-dimensional trace matching features like those described above with reference to FIGS. 4A-5, and 7A-8 (or resulting from the processes described above with respect to FIG. 6), can be included in any of the elements shown in FIG. 9. For example, the processor 996 can include a stacked semiconductor device with three-dimensional trace matching features to help regulate timing between semiconductor components. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 900 include lights, cameras, vehicles, etc. With regard to these and other examples, the system 900 can be housed in a single unit or distributed over multiple interconnected units, e.g., through a communication network. The components of the system 900 can accordingly include local and/or remote memory storage devices and any of a wide variety of suitable computer-readable media.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent that any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "approximately" and "about" are used herein to mean within at least within 10 percent of a given value or limit. Purely by way of example, an approximate ratio means within ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
    at least one semiconductor die; and
    a redistribution layer disposed over the at least one semiconductor die and extending across a longitudinal plane, wherein the redistribution layer includes:
        a first trace electrically coupled to the at least one semiconductor die, the first trace disposed in a first travel path defining a portion of a first effective path length, wherein the first travel path of the first trace is disposed fully parallel with the longitudinal plane; and
        a second trace electrically coupled to the at least one semiconductor die, the second trace disposed in a second travel path different from the first travel path, wherein the second travel path includes at least one segment neither parallel nor perpendicular to the longitudinal plane, and wherein the second travel path is configured to define a portion of a second effective path length such that the second effective path length is equal to the first effective path length.

2. The semiconductor device assembly of claim 1, wherein the redistribution layer has a third trace electrically coupled to the at least one semiconductor die and disposed in a third travel path different from the first and second travel paths, wherein the third travel path includes at least one segment neither parallel nor perpendicular to the longitudinal plane, and wherein the third travel path has a third path length equal to the first effective path length.

3. The semiconductor device assembly of claim 1, wherein the second travel path includes a partially vertical serpentine shape having a plurality of segments neither parallel to nor perpendicular to the longitudinal plane.

4. A semiconductor device assembly, comprising:
    a semiconductor device; and
    a metallization layer over the semiconductor device, wherein the metallization layer is disposed in a longitudinal plane, and wherein the metallization layer includes a bond site and a trace electrically coupled between the semiconductor device and the bond site, the trace having a travel path that includes a plurality of segments oriented at a non-right, non-zero angle with respect to the longitudinal plane.

5. The semiconductor device assembly of claim 4, wherein a number of and/or orientation of the plurality of segments with respect to the longitudinal plane is selected to match a predetermined length for the travel path of the trace.

6. The semiconductor device assembly of claim 4, wherein:
    the trace is a first trace having a first travel path;
    the semiconductor device assembly further comprises a second semiconductor device; and
    the metallization layer further includes a second trace electrically coupled between the second semiconductor device and a second bond site, the second trace having a second travel path different from the first travel path.

7. The semiconductor device assembly of claim 6, wherein the second travel path includes a plurality of segments oriented at the non-right, non-zero angle with respect to the longitudinal plane.

8. The semiconductor device assembly of claim 6, wherein the first travel path has a first effective length, and wherein the second travel path has a second effective length equal to the first effective length.

9. The semiconductor device assembly of claim 4, wherein the travel path of the trace includes a serpentine shape parallel with the longitudinal plane.

10. The semiconductor device assembly of claim 4, wherein the trace includes a conductive copper material.

11. The semiconductor device assembly of claim 4, wherein the non-right, non-zero angle is between 30 degrees and 60 degrees.

12. The semiconductor device assembly of claim 4, wherein the semiconductor device includes an active surface, and wherein the active surface of the semiconductor device includes a plurality of troughs corresponding to the plurality of segments of the trace such that each of the plurality of segments is positioned at least partially beneath an elevation of the active surface.

13. A semiconductor device assembly, comprising:
    a semiconductor die; and
    a redistribution layer carried by the semiconductor die and extending across a longitudinal plane, wherein an upper surface of the redistribution layer is at an elevation, and wherein the redistribution layer includes:
        a first trace electrically coupled to the semiconductor die, wherein a first portion of the first trace is neither parallel nor perpendicular to the longitudinal plane, and wherein the first portion of the first trace diverges from the elevation by a first distance; and
        a second trace electrically coupled to the semiconductor die, wherein a second portion of the second trace is neither parallel nor perpendicular to the longitudinal plane, and wherein the second portion of the second trace diverges from the elevation by a second distance greater than the first distance.

14. The semiconductor device assembly of claim 13, wherein the second distance is between 10 microns and 20 microns.

15. The semiconductor device assembly of claim 13, wherein the first trace is disposed in a first travel path defining a portion of a first effective path length, wherein the second trace disposed in a second travel path different from the first travel path, and wherein the second travel path defines a portion of a second effective path length such that the second effective path length is equal to the first effective path length.

16. The semiconductor device assembly of claim 15, wherein the first travel path has a first length, and wherein the second travel path has a second length greater than the first length to match the second effective path length to the first effective path length.

17. The semiconductor device assembly of claim 13, wherein the redistribution layer has a third trace electrically coupled to the semiconductor die, wherein a third portion of the third trace is neither parallel nor perpendicular to the longitudinal plane, and wherein the third portion of the third trace diverges from the elevation by a third distance greater than the first distance and the second distance.

18. The semiconductor device assembly of claim 13, wherein the second trace includes a partially vertical serpentine shape having a plurality of segments neither parallel to nor perpendicular to the longitudinal plane.

19. The semiconductor device assembly of claim 13, wherein the semiconductor die includes an active surface, and wherein the active surface includes:
    a first trough corresponding to the first portion of the first trace such that the first portion is positioned at least partially beneath the active surface; and a second trough corresponding to the second portion of the second trace such that the second portion is positioned at least partially beneath the active surface.

* * * * *